United States Patent [19]
Katz

[11] Patent Number: 5,990,750
[45] Date of Patent: Nov. 23, 1999

[54] AMPLIFIER AND DRIVER SYSTEM WITH MULTICHANNEL OPERATION

[75] Inventor: Allen Katz, Mercer County, N.J.

[73] Assignee: Lockheed Martin Corporation, Sunnyvale, Calif.

[21] Appl. No.: 09/039,907

[22] Filed: Mar. 16, 1998

[51] Int. Cl.[6] ............................... H03F 3/68; H03F 3/04; H02H 7/20
[52] U.S. Cl. ..................... 330/295; 330/298; 330/311
[58] Field of Search ................. 330/124 R, 149, 330/207 P, 277, 295, 298, 311

[56] References Cited

U.S. PATENT DOCUMENTS

| | | | |
|---|---|---|---|
| 4,241,266 | 12/1980 | Orban | 307/237 |
| 4,249,137 | 2/1981 | Malchow | 330/283 |
| 4,468,631 | 8/1984 | Goldberg | 330/284 |
| 4,743,863 | 5/1988 | Cassany et al. | 330/284 |
| 4,916,407 | 4/1990 | Olver | 330/151 |
| 4,992,753 | 2/1991 | Jenson et al. | 330/129 |
| 5,119,042 | 6/1992 | Crampton et al. | 330/295 |
| 5,191,338 | 3/1993 | Katz et al. | 342/352 |
| 5,420,541 | 5/1995 | Upton et al. | 330/286 |
| 5,770,970 | 6/1998 | Ikeda et al. | 330/295 |
| 5,789,979 | 8/1998 | Kumar et al. | 330/149 |

*Primary Examiner*—Robert Pascal
*Assistant Examiner*—Patricia T. Nguyen
*Attorney, Agent, or Firm*—W. H. Meise; R. P. Kennedy

[57] ABSTRACT

An RF amplifier includes a FET output stage and a driver. The FET is subject to long-term degradation in multiple-carrier use if its average gate current often exceeds a predetermined value. The random superposition of signal peaks of the multicarrier signal may cause such peaks to occur. The driver stage is selected to provide a range of four dB or less between the single-signal 1 dB compression point and the hard compression point, as measured by driver input signal level. This prevents application of excessive input signal to the output stage in a multicarrier situation, and prevents degradation of the FETs of the output stage. In one embodiment, a predistortion equalizer or linearizer is placed before the driver stage, to tend to linearize the characteristic of the driver and output stage combination at signal levels below those at which the driver is limited.

4 Claims, 7 Drawing Sheets

*Fig.9a*

AMPLIFIER AND DRIVER SYSTEM WITH MULTICHANNEL OPERATION

FIELD OF THE INVENTION

This invention relates to signal amplifiers, and more particularly to signal amplifiers for multicarrier operation, especially at RF frequencies.

BACKGROUND OF THE INVENTION

Spacecraft communications systems are now widely used for communications among terrestrial sites, and for broadcast purposes.

Spacecraft are associated with large capital costs for construction, for launch, and for maintenance in orbit. As a result, it has been very important to maximize the useful or operational life of each communication spacecraft, and to maximize its utility during its period of operation. Since thrust is required to maintain a spacecraft in proper position and attitude, the spacecraft must carry propellant for providing the thrust. An important aspect of spacecraft design is that of maximizing the amount of propellant which the spacecraft carries into orbit, in order to maximize the interval during which thrust may be provided. This, in turn, requires minimization of the weight of every other portion of the spacecraft, including the communication payload.

The communication payload of a communication spacecraft commonly includes antennas, frequency converters, amplifiers, and a power system for generating electrical power from sunlight for powering the electrical equipment. As mentioned, the spacecraft is very costly. It is very important that each functional portion of the spacecraft be very reliable, so that the equipment failures do not render the communication spacecraft inoperative. In order to provide reliable operation, the various components are carefully selected, qualified for operation in space, and tested both individually and when assembled.

Communications between the communication spacecraft and the ground are by way of radio-frequency electromagnetic radiation. The operating frequency of the radiation is determined, in part, by the wavelength of the signal carriers, which in turn determines the size, and therefor the gain, of the antennas on the spacecraft. There is a tradeoff between antenna size and gain, which favors using higher frequencies. The frequencies currently used for commercial communication spacecraft are generally above 2 GHZ. While higher frequencies are better from the point of view of the antenna size and gain, there are countervailing considerations. For example, atmospheric losses or attenuation tend to be higher at frequencies much higher than 12 GHZ, and the efficacy of other electronic equipment, such as amplifiers, frequency converters, and interconnecting transmission lines, tend to be less than at lower frequencies. Thus, the operating frequency of such equipment is always a compromise of various competing factors. These factors result in operating frequencies which desirably lie between 3 and 15 GHz.

When spacecraft began to be used for communications, solid-state amplifiers were not capable of reliable operation at the required frequencies and power levels, and the travelling-wave tube (TWT), a type of vacuum tube adapted for operation at frequencies in the range of 3 to 15 GHz, were used, even though the reliability advantage of solid-state amplifiers was recognized. Solid-state amplifiers have been used to some extent, but as the technology of solid-state amplifiers has improved, the requirements placed on the amplifiers have become more severe. For example, the advent of direct-broadcast satellites has increased the power required to be delivered to the spacecraft antennas, and multichannel operation has become common. These factors, together with improvements in travelling-wave tubes, have resulted in significant use of travelling-wave tubes in present-day communication satellites, notwithstanding the recognition of their limited lifetime.

Solid-state amplifiers for operation at radio frequencies at power comparable to that of travelling-wave tubes now almost invariably use field-effect transistor (FET) amplifiers. Because of the relatively low output power of a single solid-state amplifier at the desired frequencies, a solid-state amplifier for communication use often includes paralleled FET transistor output stages, which are optimized to maximize the output power while tending to minimize distortion, and which are sufficient in number to produce, together, the desired signal output power. Because of the relatively high operating frequencies, the FETs of such amplifiers are often based on GaAs technology, which provide good high-frequency operation. In order to maximize the power gain, the FETs are operated in the common-source configuration, with the operating conditions, such as the bias conditions and the input and output impedances, adjusted to provide the desired instantaneous bandwidth necessary to accommodate the multiple carriers without too sharp a gain cutoff.

Because of the relatively low gain of a stage of solid-state amplification at the desired frequencies, a solid-state amplifier for communication use includes a cascade of stages, in which ordinarily only the last stage is a paralleled stage as described above. The distortion in a single-carrier amplifier is usually defined by gain compression. Gain compression is measured by applying an increasing amplitude of the single signal carrier to be amplified to the gate of the FET of the amplifier stage, and comparing the output power with the input power. So long as the input and output signal levels are low, the gain of such a stage tend to be at a maximum value, which is the "small-signal" gain. As the input signal level increases, the output signal level also tends to increase. The gain of the stage tends to decrease as the output signal level increases, so that the output power of the stage is less than might be expected based upon the small-signal gain. The usual measure of gain compression is made at the one-dB point, which defines an operating condition in which the output signal power is one dB, or about 25%, less than would be the case if the small-signal gain were maintained over the entire output signal range.

When a solid-state amplifier must amplify or carry multiple signal carriers, the one-dB gain compression point is no longer useful as an indicator of the operating point, because the presence of multiple carriers results in intermodulation, or mutual modulation among or between the carriers. The amount of signal power which a given amplifier can produce for each carrier in a multiple-carrier context is significantly less than that which it can produce in a single-channel context.

A solid-state amplifier for a communication spacecraft, then, includes a plurality of cascaded stages of amplification, in which at least the output stage consists of a plurality of GaAs FET stages, which are paralleled to produce the desired output power. It is well known that, because of the relatively low gain of the paralleled output a stage of a solid-state amplifier, there may be a significant contribution by the driver stage(s) to the overall distortion of the cascaded stages. A well-known arrangement for overcoming the combined distortion of the various stages of a cascaded solid-state amplifier is to interpose a distortion equalizer in the cascade. Such distortion equalizers are described, for example, by U.S. Pat. No. 5,221,908, issued Jun. 22, 1993 in the name of Katz, U.S. Pat. No. 5,146,177, issued Sep. 8, 1992 in the name of Katz et al., U.S. Pat. No. 5,038,113, issued Aug. 6, 1991 in the name of Katz et al., and U.S. Pat. No. 4,588,958, issued May 13, 1986, in the name of Katz et al.

One of the problems associated with the use of solid-state devices generally, and GaAs FETs particularly, is that of sensitivity to excessive signal level. The reliability of solid-state devices is very high, except when its ratings are exceeded. Common situations in which ratings may be exceeded are those in which the temperature of the chip rises above its rated temperature, or in which its direct operating voltages are exceeded. Because of the need to obtain the maximum signal output power from each FET of the paralleled output stage of a FET amplifier, each of the FETs is operated near its maximum allowable limits. Among the limitations is that of not exceeding the gate signal drive power. In a multicarrier context, the instantaneous peak signal power is many times the average signal power. The peak signal power $P_i$ is defined by $$P_i = 2N\, P_{avg} \qquad 1$$

where $P_{avg}$ is the effective or average power of the multi-carrier signal. Although the peak signal power level occurs infrequently or only occasionally, it has the capability of significantly degrading the performance of the output or power stage of the FET amplifier if continued over an extended period of time. Because of the difficulty encountered in determining the exact occurrences of $P_i$, the manufacturer specifies the maximum gate signal drive in a multicarrier context in terms of the gate current drawn. For a given type of FET transistor, the maximum average gate current which may be drawn is specified. Thus, if the multicarrier signal input to the gate of any transistor of the given type exceeds the rated value, the performance may be degraded. One way to guarantee that the limiting value of gate current is not drawn in a multicarrier context is to operate the output or power stage much below its ratings, so that the input signal level can never cause the rated gate current. This, however, is very inefficient, because the full capability of the FETs of the output stage is not utilized.

Improved FET amplifiers are desired.

SUMMARY OF THE INVENTION

A signal amplifying system includes an output port at which amplified signal is generated. The system also includes a field-effect transistor (FET) including a gate, a source, and drain. The FET may be GaAs-based. The FET is connected in common-source configuration for amplification of signal, and is subject to permanent degradation of its performance when the gate signal reaches a particular power level. The particular gate power level at which degradation occurs varies from transistor to transistor, even within the same transistor type. The drain of the FET is coupled to the output port of the amplifying system without intermediary active stages. Consequently, the FET is an output stage of the signal amplifying system. The signal amplifying system also includes a source of multiple modulated carrier signals to be amplified. A driver amplifier stage includes an input port and an output port. The output port of the driver amplifier stage is coupled to the gate of the FET without intermediary active stages. The driver amplifier stage has a distortion characteristic such that, for a single-carrier signal, the one-dB compression point is within four dB of input signal of the hard power saturation point. A coupling arrangement is coupled to the source of multiple modulated carrier signals and to the input port of the driver amplifier stage, for coupling the multiple modulated carrier signals to the driver stage at a signal level which drives the driver amplifier stage into saturation, and such that the instantaneous peak envelope signal level at the output port of the driver stage never exceeds the maximum input power level to the gate of the FET which is specified by the manufacturer of the FET for reliable operation. The maximum input power level to the FET is normally specified by the manufacturer in terms of a maximum average gate current, so the saturated output of the driver amplifier stage as it arrives at the gate of the FET should not cause a gate current exceeding the specified gate current. This adjustment of the driver amplifier stage provides good performance with complete protection of the FET. In a variant of this embodiment, a distortion equalizer is coupled between the source of multiple carrier signals and the input port of the driver amplifier stage, with its characteristics selected so as to reduce the four dB range to less than one dB.

DESCRIPTION OF THE INVENTION

Figure 1:
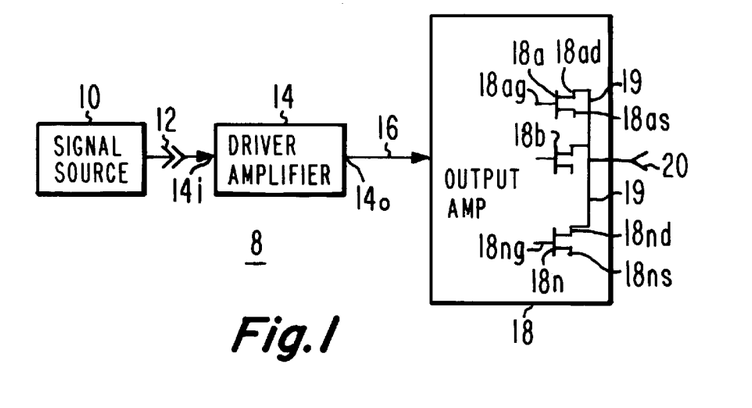
FIG. 1 is a simplified block diagram of an amplifier-driver arrangement.

FIG. 1 represents an amplifying arrangement, in which a signal source 10 produces radio-frequency (RF) signals to be amplified. In contemporary usage, the term RF means any electromagnetic frequency extending from, at the low end, the traditional AM frequencies of 550–1600 KHz, to, at the upper end, the lower reaches of light frequencies. The signals produced by source 10 are applied by way of an input port 12 to an amplifier cascade including a driver amplifier 14 and a final, output, HPA, or power amplifier 18. Signal amplified by the cascade of driver 14 and output amplifier 18 appears in amplified form at output port 20. Output amplifier stage 18 includes a single field-effect transistor (FET), or multiple paralleled FETs, each of which is connected in the common-source configuration for highest power gain. At the present state of the art, GaAs FETs provide the best high-frequency operation at reasonable cost. GaAs FETs can, at the present state of the art, provide useful gain up to at least 100 GHz.

At the present state of the art, GaAs FETs for amplification at frequencies above about 1 GHz are quite limited in the amount of power which they can produce at their output electrodes, which in the common-source configuration corresponds to their drain electrodes. Consequently, it is necessary to parallel so many FET amplifiers as may be necessary in output amplifier stage 18 in order to produce the desired output power of the amplified output signal appearing at output port 20. Consequently, stage 18 of FIG. 1 represents a single gain stage consisting of one or more paralleled FET amplifiers 18a, 18b, . . . , 18n,. The gates of the individual FETs 18a, 18b, . . . 18n are coupled together by power dividing and impedance matching arrangements, not illustrated, which are well known in the art, for driving the individual FETs by way of signal path 16 from driver stage 14.

Figure 2:
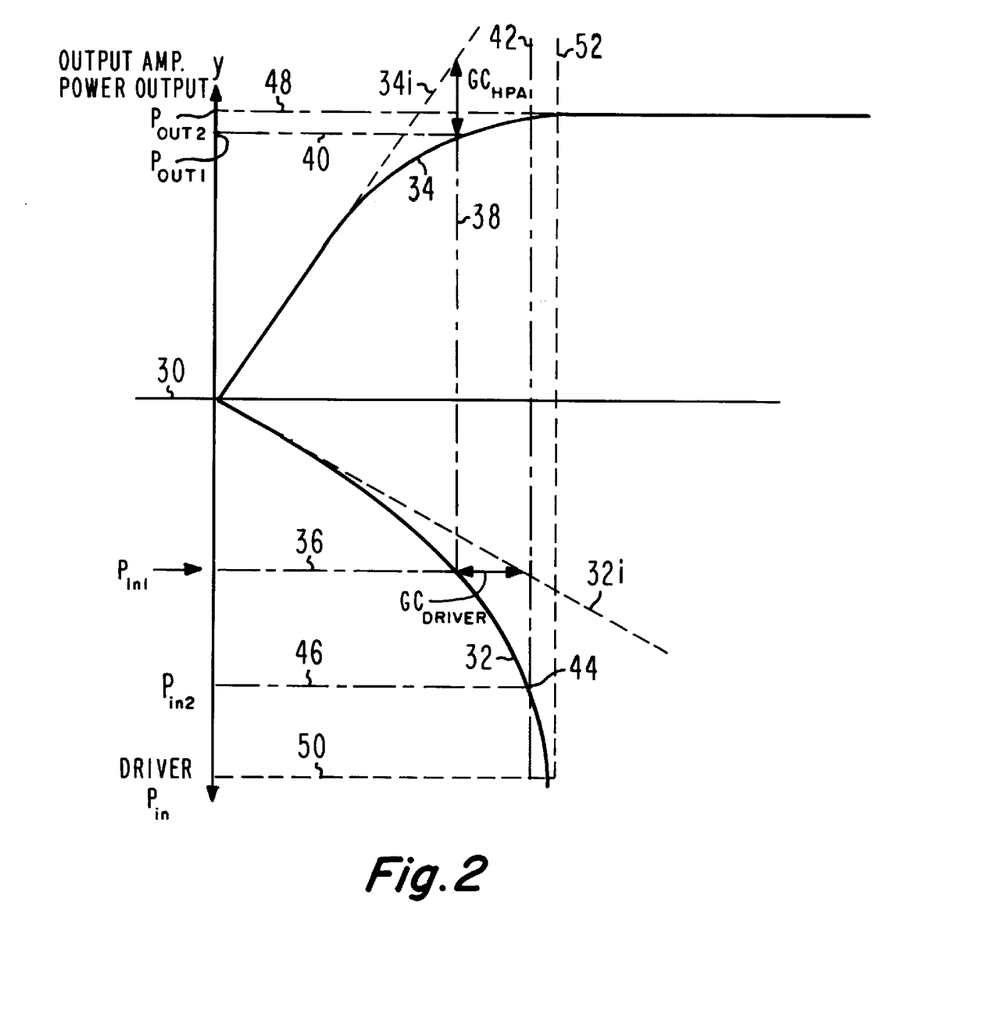
FIG. 2 represents a simplified plot of the transfer functions or characteristics of the amplifier and driver of FIG. 1, showing the effect of gain compression.

FIG. 2 plots the transfer functions of the driver and output stages of FIG. 1. In FIG. 2, an X-axis represents the signal output power of driver stage 14 of FIG. 1, and also represents the signal input power of final stage 18. The Y axis represents, for the plot 32 lying below the x-axis, the input power to the driver stage 14 of FIG. 1, and for the plot 34 lying above the x-axis, the Y axis represents the output power of the output stage 18. Plot 32 represents the output level of the driver stage for a given input or output signal level of the driver stage. Dashed straight-line plot 32i represents the ideal amplitude characteristic or small-signal transfer characteristic of driver stage 14 of FIG. 1, which is a simple projection of the tangent to plot 32 at the small-signal end of the plot. The deviation of plot 32 from ideal plot 32i represents the compression distortion which occurs when driver amplifier 14 is operated at a given signal level. More particularly, at a signal input power represented by $P_{in1}$ lying along the Y-axis, a line 36 projected to the right intersects plots 32 and 32i at different locations; the horizontal distance between the intersections, designated $GC_{driver}$, represents the distortion in the form of gain compression.

Plots 32 and 34 of FIG. 2 are laid out in a conventional manner, which allows determining the signal output power $P_{out}$ produced by the output stage 18 from the signal input power $P_{in}$ to the driver stage. For example, the signal output power level from the driver stage for a given signal input power level is represented by plot 32, and this signal output power level of the driver stage also corresponds to the signal power level on signal path 16 of FIG. 1; this corresponds exactly with the signal input power level to the output stage 18 of FIG. 1. As a more particular example, at a signal input power level of $P_{in1}$ as represented in FIG. 2, the driver produces an output signal power represented by vertical dot-dash line 38. The intersection of dot-dash line 38 with plot 34 corresponds with an output stage signal output power level $P_{out1}$, as can be determined from the projection line 40. As in the case of the driver stage, the output stage is subject to gain compression, represented in FIG. 2 by the difference $GC_{HPA}$. The gain compression of the signal traversing both the driver and output amplifier stages of FIG. 1 is the sum of the gain compressions $GC_{driver}$ and $GC_{HPA}$, expressed in dB. In some signal amplifiers used for amplification of single television channels, a gain compression of one-half dB or one dB has been used to define the distortion at the maximum output signal level. Correspondingly, a measure of the merit of such a signal amplifier is the magnitude of the signal output at which one-half dB (or one dB) of gain compression occurs.

As so far described, amplification has been applied to a single signal, with the result that gain compression takes place. When multiple signals are amplified, gain compression may not be the best measure of distortion. In a multi-channel signal context, intermodulation between the multiple signal carriers results in the appearance of additional distortion components at various inband and out-of-band frequencies, as is well known in the art. These intermodulation distortion components affect the signal modulation of other carriers being amplified, and produce a type of distortion which is well known in the cable television industry as fine wavy moving lines in the picture. It has long been known that it is necessary to "back off" or reduce the signal level of multiple signal carriers at the output of the output amplifier from the signal level at which a single carrier experiences half-dB compression, in order to reduce intermodulation distortion to acceptable levels. As described above in relation to FIG. 2, the distortion of the driver stage adds to the distortion of the output stage, and its signal level must be taken into account in determining the overall operation of the amplifier arrangement. In general, it is well known that the distortion contribution of the driver is minimized by increasing the gain of the output stage, and that pre- or post-distortion equalizers can be associated with the stages of a multichannel signal amplifier to aid in maximizing the signal output power of such an amplifier, as described in the abovementioned patents.

In the plots of FIG. 2, horizontal dot-dash line 48 represents a signal output power $P_{out2}$, produced by the output amplifier stage 18 of FIG. 1, which is associated with the limit FET average gate current specified by the FET manufacturer. Horizontal line 48 intersects the transfer response curve 34 of the output stage (18 of FIG. 1) at a vertical dot-dash line 42, which represents the signal input power to the output stage which produces the damaging level of output power. Vertical dot-dash line 42 also represents the output signal power of the driver stage (14 of FIG. 1) which produces the damaging level of power from the output stage (18). Vertical line 42 intersects the driver transfer characteristic 32 at a point 44. A dot-dash line 46 projecting horizontally to the left from point 44 corresponds to a driver input signal level of $P_{in2}$, which is sufficient, if achieved repeatedly, to damage the FETs of the output amplifier. An input power level in excess of $P_{in2}$ to the driver stage, such as that represented by dash line 50, results in saturated power output from the driver stage at a level represented by dash line 52, which results in an output power from the output stage which is in excess of the damaging signal output power.

Figure 3:
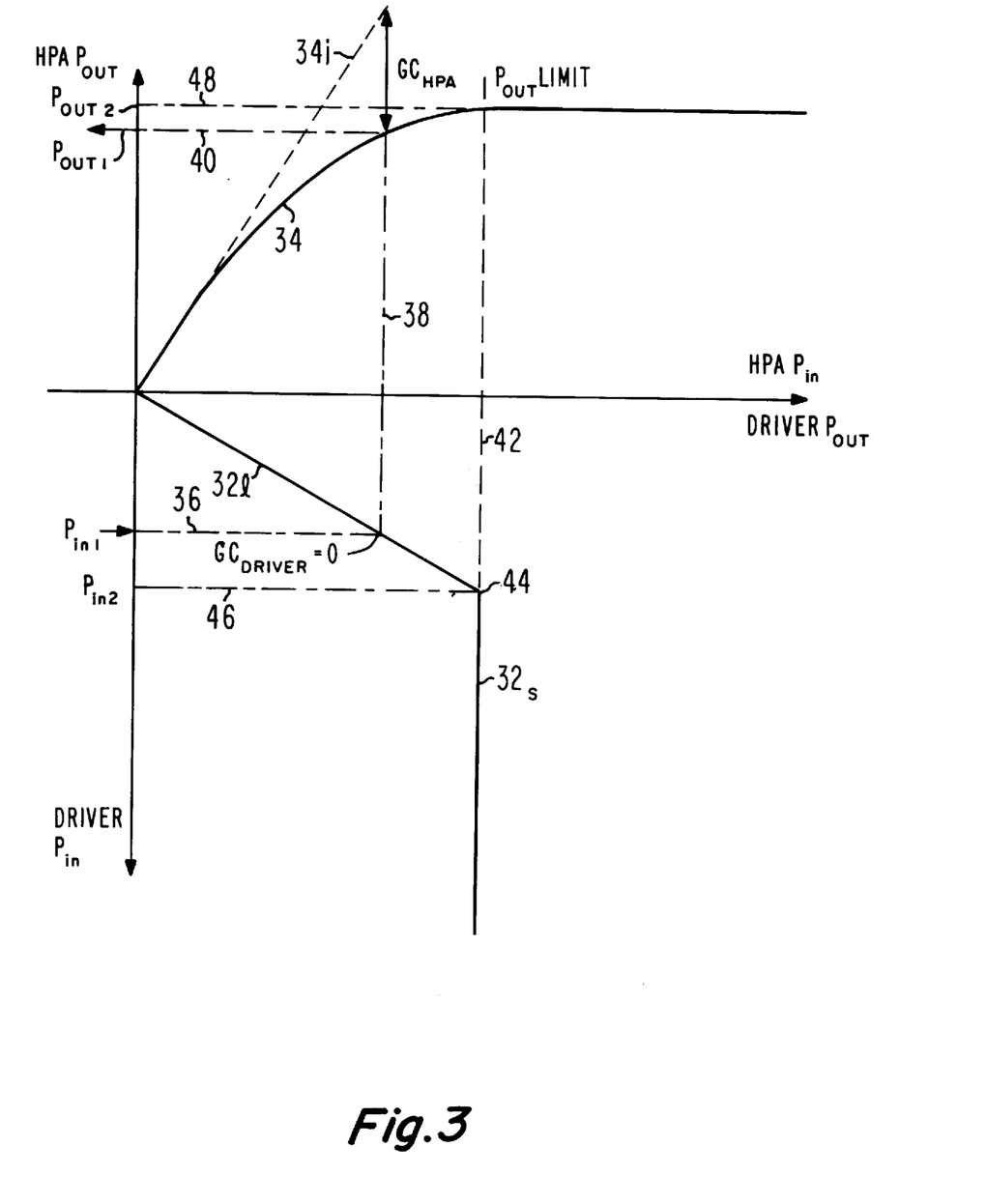
FIG. 3 represents a plot similar to that of FIG. 2, but with the characteristics of the driver stage idealized.

FIG. 3 represents plots of the gain and compression of the driver (14 of FIG. 1) and the output stage (18 of FIG. 1), where the characteristics of the driver are idealized into two portions, a first portion of which is a linear portion $32_1$, and a second portion of which is a saturated portion $32_s$. In the plots of FIG. 3, an input signal power of $P_{in1}$, results in no gain compression at the driver stage, so $GC_{driver}=0$, and, following line 38 upward to its intersection with output stage gain plot 34, and then following line 40 to the left, the signal output power can be seen to be $P_{out1}$, which will be slightly higher than the corresponding value in FIG. 2, because the gain of the driver stage is assumed in FIG. 3 to be the ideal gain, rather than the compressed gain. The salient advantage of the arrangement of FIG. 3, if it were possible to achieve such an idealized response, is that the transition between linear portion 321 and the saturated portion $32_s$ of the driver response occurs at or below that value of driver signal output power represented by vertical dash line 42 which produces the limit value $P_{out2}$ of signal output power from the output stage. Thus, at the signal input power level represented by the value $P_{in2}$ of FIG. 3, the signal output power $P_{out2}$ produced by the output stage is at its maximum allowable value, and so the output stage cannot be damaged at that level. If the input signal value should chance to exceed the value represented by $P_{in2}$ of FIG. 3, the output signal amplitude by the driver would not increase, since the gain of the driver is in the saturated portion $32_s$ of the characteristic. With an idealized arrangement such as that represented by FIG. 3, the output stage would be totally protected against degradation due to excessive instantaneous signal input power to the gates of the FETs of the output stage. As an additional advantage of the arrangement of FIG. 3, the driver stage contribution to distortion would be zero, since the idealized plot portion $32_1$ is linear. Consequently, a somewhat higher level of output stage distortion could be accepted, without exceeding the limit value of the sum distortion of the driver and output stages.

Figure 4A:
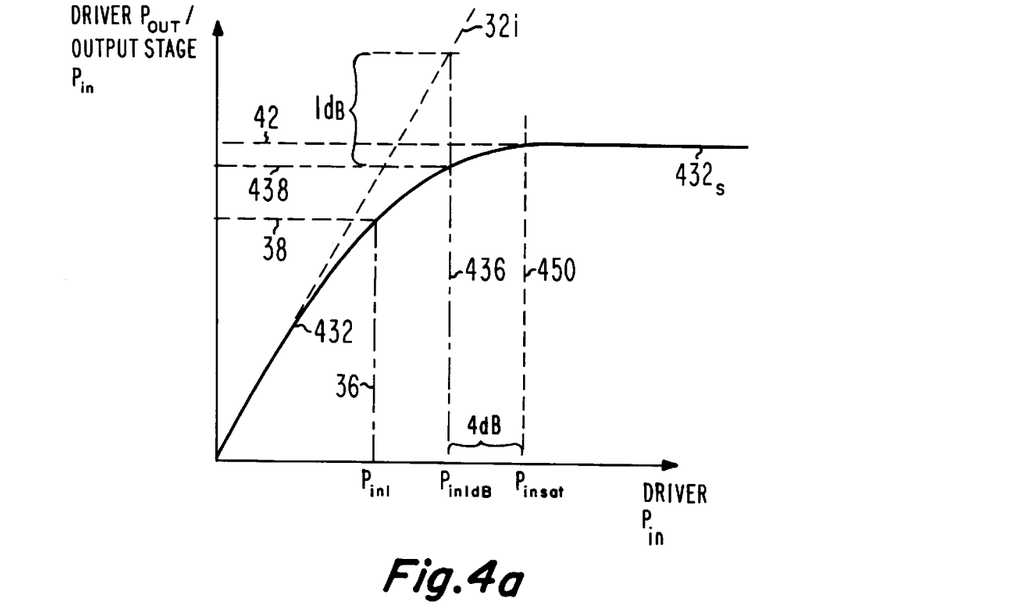
FIG. 4a represents a plot of the transfer characteristics of the driver stage of FIG. 1 in accordance with an aspect of the invention.

While the idealized operating system as described in conjunction with FIG. 3 would be advantageous, those skilled in the art know that such idealized responses cannot be achieved, and also know that it is not clear how idealized single-channel operation can be translated into corresponding multichannel operation. According to an aspect of the invention, the driver stage is operated in a condition in which the single-channel one-dB gain compression point is within four dB of the hard saturation point, as measured by the signal input to the driver stage. Referring to FIG. 4a, plot 432 represents a driver stage corresponding to driver stage 14 of FIG. 1, operated in accordance with the invention. In FIG. 4a, $P_{in1}$ represents an input power which might correspond to an operating signal level, and the projection of line 38 to the left from the intersection of line 36 with plot 432 represents the signal power produced by the driver stage in response to signal input level $P_{in1}$, which is available to drive the output stage 18 of FIG. 1. In FIG. 4a, $P_{in1dB}$ represents a single-signal input power level which results in one-dB of gain compression. This can be readily understood by projecting upward along vertical dot-dash line 436 from $P_{in1dB}$, and noting that the intersection of line 436 with horizontal projection line 438 is removed by one dB from the intersection of vertical dot-dash line 436 with small-signal gain dash-line $32i$. Also in FIG. 4a, power input level $P_{insat}$ represents an input signal level which results in hard saturation of the driver stage. In accordance with an aspect of the invention, the driver stage is operated with parameters adjusted so that the single-signal one-dB gain compression input signal level or power ($P_{in1dB}$) is no more than four dB less than the input signal level or power ($P_{insat}$) which produces saturated output from the driver, as illustrated in FIG. 4a, and with the hard-saturated output level of the driver no greater than that which produces the manufacturer-specified gate current. The distortion of the driver stage is a function of a number of variables, well known to those skilled in the art, such as the bandwidth of the driver, the input and output impedances of the driver and the source and load impedances presented to it, the source-to-drain voltage and current, and the like, and notably the transistor type. A particularly advantageous driver transistor has been found to be Nippon Electric Corp. (NEC) type NE137, operated at about 3 volts source-to-drain, at a source-to-drain current of about 15 mA. This arrangement allows relatively simple single-channel measurements made on the driver stage and measurements of the output stage average gate current to be used to design an amplifier system which prevents damage to the output stage under any multichannel operating condition.

Figure 4B:
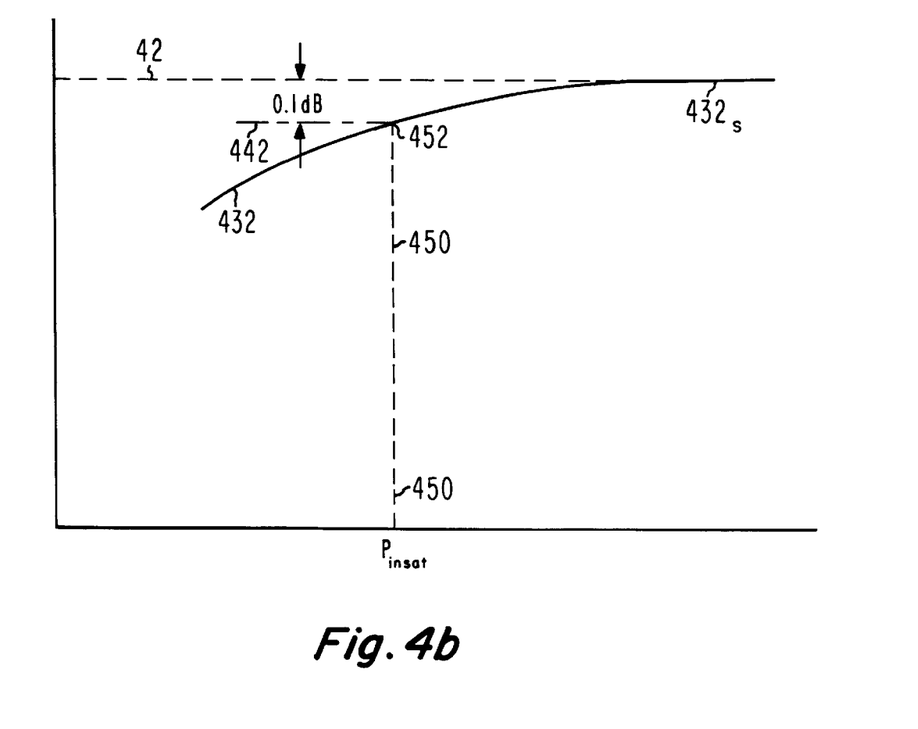
FIG. 4b is a detail thereof.

FIG. 4b is a detail of the region of FIG. 4a near the intersection of plots 432, 432s, and 450. In FIG. 4b, the vertical line 450 which corresponds to saturated driver input signal level $P_{insat}$ intersects the plot portions 432, $432_s$ at a point 452 which is below line 42 by no more than 0.1 dB, corresponding to about 4%. This effectively defines the value of $P_{insat}$ as the value of input signal applied to the driver stage which brings the output signal of the driver stage to within 0.1 dB of its fully saturated value.

Figure 5A:
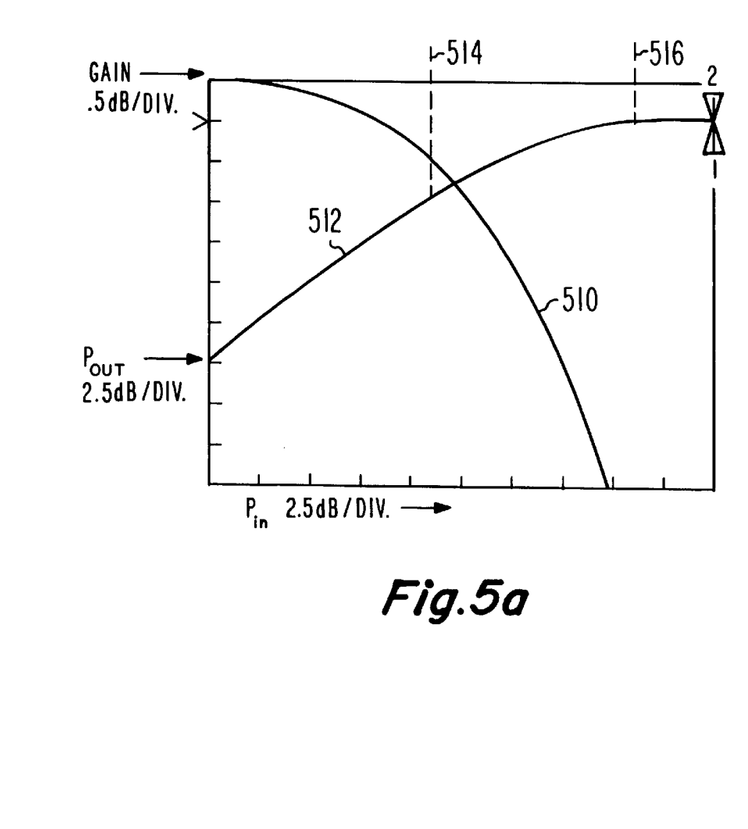
FIG. 5a plots the gain and output power of a less optimal driver stage against input power, and FIG. 5b plots its phase change against input power.
Figure 5B:
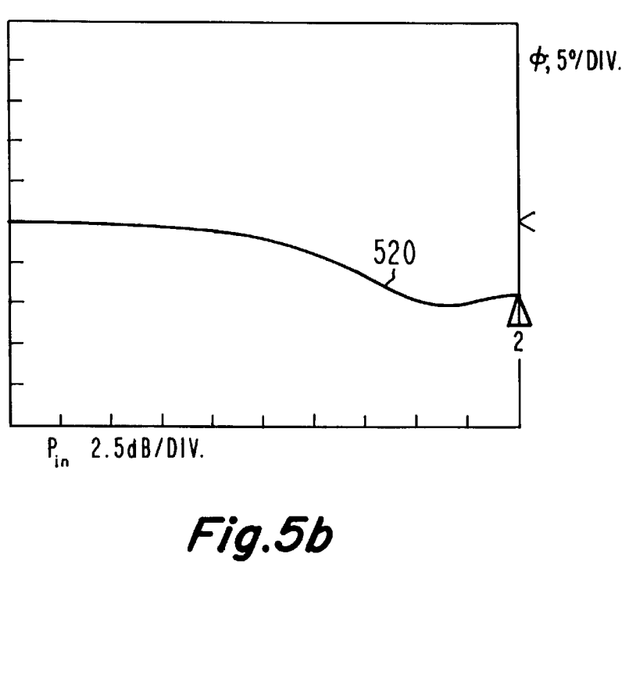
Figure 6A:
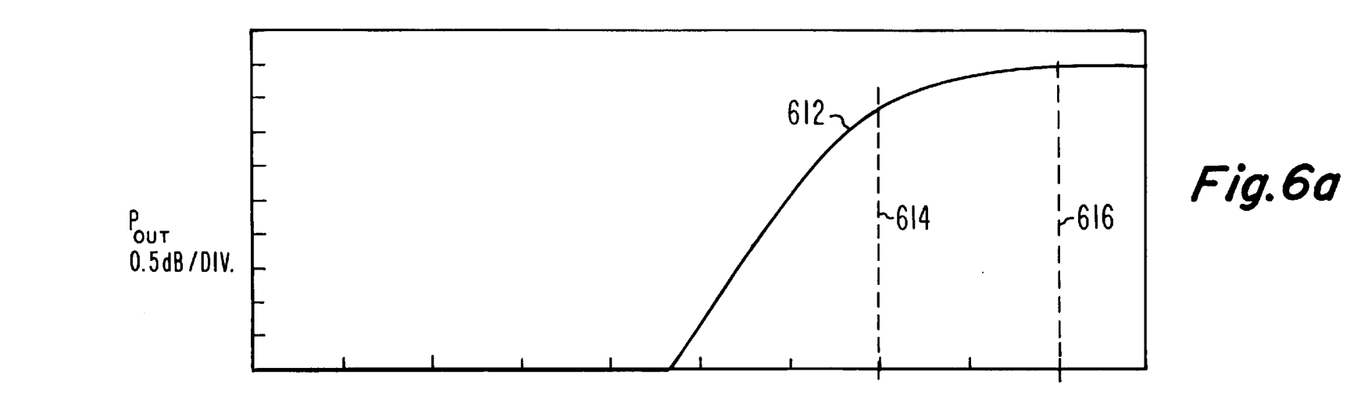
FIG. 6a plots output power against input power for a more optimal driver stage, and FIG. 6b plots gain and phase change against input power.
Figure 6B:
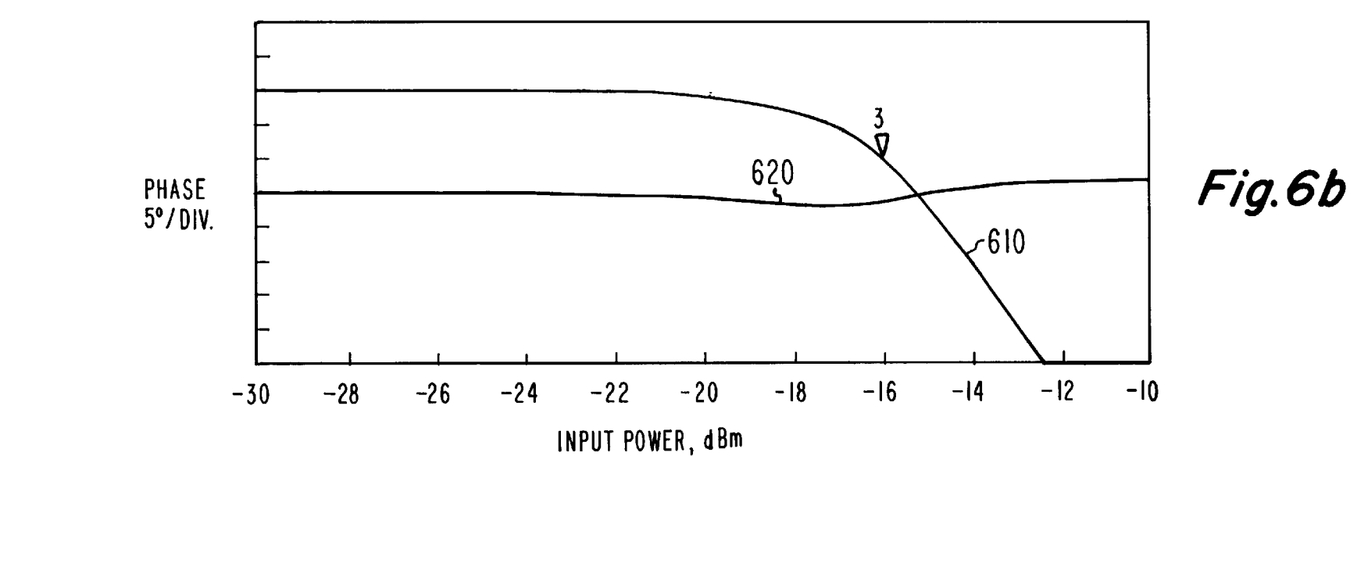

FIGS. 5a and 5b are plots of the characteristics at 12 GHz of a driver stage, such as driver stage 14 of FIG. 1, under less-than optimal operating conditions. In FIG. 5a, 510 is a plot of gain (0.5 dB per division vertically) versus input power level $P_{in}$, (2.5 dB per division). Plot 512 is the corresponding output power $P_{out}$ (2.5 dB per division). Plot 520 of FIG. 5b illustrates phase as a function of input signal level, with the vertical scale being 5°/division, and the horizontal scale being 2.5 dB/division. At low input signal power levels, namely at the left of FIGS. 5a and 5b, the gain is at its highest or reference (small-signal) level, $P_{out}/P_{in}$ is positive and essentially linear, and the phase is at its reference value. With increasing input signal level, the phase deviates by no more than 10°, the gain decreases, and the output signal level $P_{out}$ reaches a limiting value. The limiting characteristic of the driver amplifier stage is desired. However, it will be noted that 1 dB of gain compression occurs at dash line 514, and that, if it is assumed that hard limiting occurs at 516 of plot 512, there are about four divisions of input signal level, at $^2$ ½ dB per division, between the one-dB gain compression point and the hard saturation point, corresponding to about ten dB. As mentioned above, the desired difference is four FIGS. 6a and 6b are plots of the characteristics at 12 GHz of a driver stage, such as driver stage 14 of FIG. 1, under more optimal operating conditions than the situation for FIGS. 5a and 5b. It is somewhat difficult to quantify the impedances which are presented to the driver FET, since operation is in a nonlinear region. In FIG. 6b, 610 is a plot of gain (0.5 dB per division vertically) versus input power level $P_{in}$ (2.0 dB per division) at 4.0 GHz. Plot 612 of FIG. 6a is the corresponding output power $P_{out}$ (0.5 dB per division). Plot 620 of FIG. 6b illustrates phase as a function of input signal level, with the vertical scale being 5°/division, and the horizontal scale being 2.0 dB/division. At low input signal power levels, namely at the left of FIGS. 6a and 6b, the gain is at its highest or reference (small-signal) level, and the phase is at its reference value. $P_{out}$ does not lie on the plot at the lowest input signal levels of FIG. 6a. With increasing input signal level, the phase deviates by no more than about 5°, the gain decreases, and the output signal level $P_{out}$ reaches a limiting value. It will be noted that 1 dB of gain compression occurs at dash line 614, and that, if it is assumed that hard limiting occurs at 616 of plot 612, there are about two divisions of input signal level, at 2 dB per division, between the one-dB gain compression point and the hard saturation point, corresponding to about four dB, which, as mentioned above, is the desired difference.

Figure 7:
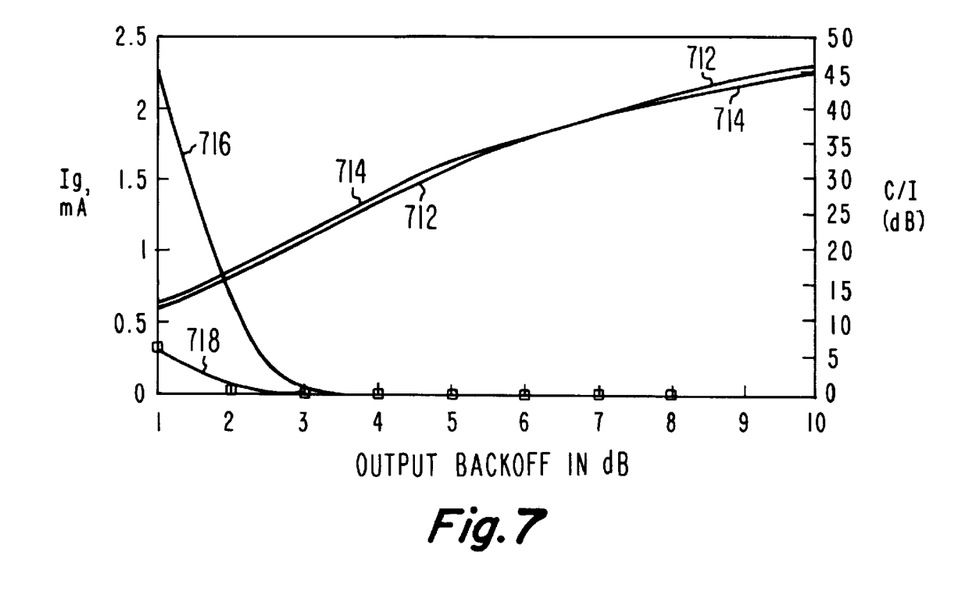
FIG. 7 plots carrier-to-intermodulation ratio and output stage FET gate current, both against output power backoff from a maximum output level.

Plots 712 and 714 of FIG. 7 represent carrier-to-intermodulation ratio in dB for an output solid-state power amplifier alone, and for the same solid-state output power amplifier with a driver amplifier similar to that which gave the results of FIGS. 6a and 6b, respectively, plotted against output level backoff, in dB, from a selected maximum output signal level. In FIG. 7, the lowest signal output level is at the right of the plots, and the highest signal output level is at the left. Plots 712 and 714 almost coincide, thus indicating that the driver amplifier makes little difference to the distortion C/I. To the extent that there is any difference, the output power amplifier alone (plot 712) produces about 1 dB lower C/I toward the left of the plot of FIG. 7. At lower values of signal level, near the right of the plot of FIG. 7, the combination of the driver with the power output stage has about 1 dB lower distortion. It can therefore be seen that the driver stage does not have much effect on the output power distortion characteristic. However, the effect of the presence of the limiting characteristic of the driver stage on the gate current of the FET of the output stage is remarkable. Plot 716 represents the average gate current without the driver stage. It can be seen that the average gate current of plot 716 reaches as much as about 2.3 mA at output signal levels within one decibel of maximum output without the presence of the limiting driver. With the driver, the gate current of the FET of the output stage reaches only about 0.4 mA. At backoff levels of about 3 db, where normal operation might be expected, the gate currents represented by plot 718 are essentially zero. As explained above, such low gate current is associated with good reliability and least degradation of performance over time.

According to a further aspect of the invention, a distortion equalizer is associated with the amplifier stage, to tend to improve the linearity of the linear region of the driver stage operating characteristic. The response of the distortion equalizer at signal levels which result in saturated output of the driver stage is irrelevant, so the distortion equalizer is easier to design than would be the case if the equalizer were required to track a curve into the region of the driver characteristic which is, according to the invention, saturated.

Figure 8:
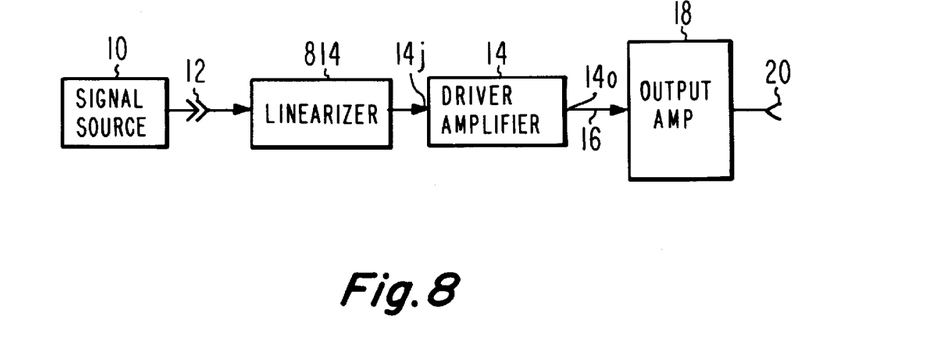
FIG. 8 is a simplified block diagram of a linearized cascade of a driver and output stage, with the linearizer preceding the driver stage.

Those skilled in the art will recognize that the linearity of the driver with the output stage inherently has nonlinearity in the region below the level which puts the driver stage into compression. FIG. 8 is a simplified block diagram similar to FIG. 1, but including a linearizer or predistortion equalizer 814 interposed between terminal 12 and driver amplifier 14. Linearizer 814 may be of any type which provides a disproportionately increasing output amplitude in response to increasing signal input level. Suitable linearizers include those described in U.S Pat. No. 5,146,177 issued Sep. 8, 1992 in the name of Katz et al.; 5,162,748, issued Nov. 10, 1992 in the name of Katz; 5,191,338, issued Mar. 2, 1993 in the name of Katz et al.; and 5,221,908, issued Jun. 22, 1993 in the name of Katz et al. The increasing signal characteristic of the linearizer, of course, might be thought to result in a combined linearizer/driver transfer characteristic which has a positive slope in the region in which the driver is in saturation, but this is not so, because the linearizer cannot make the driver output level increase by even a small amount above the hardlimit threshold. Consequently, the combination of the driver 14 and power output stage 18 can be linearized in the region below hard saturation of the driver stage, without affecting the protection against overdrive in multiple-carrier situations which is afforded by the limiting characteristic of the driver stage 14.

Figure 9A:
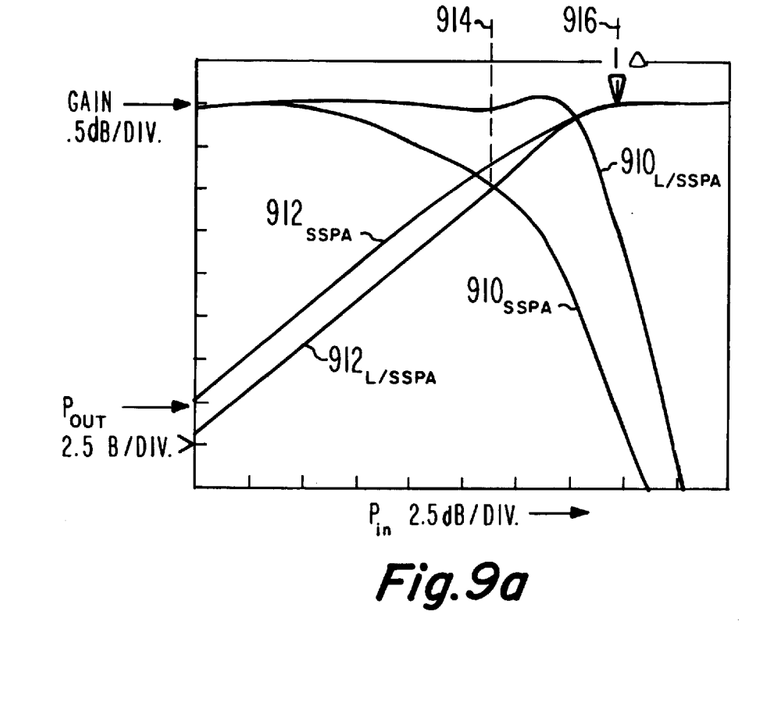
FIG. 9a plots gain and output power against input power for a cascade of a driver and output stage, and for a cascade of a linearizer with the driver and output stage, and FIG. 9b plots phase change against input power for both.
Figure 9B:
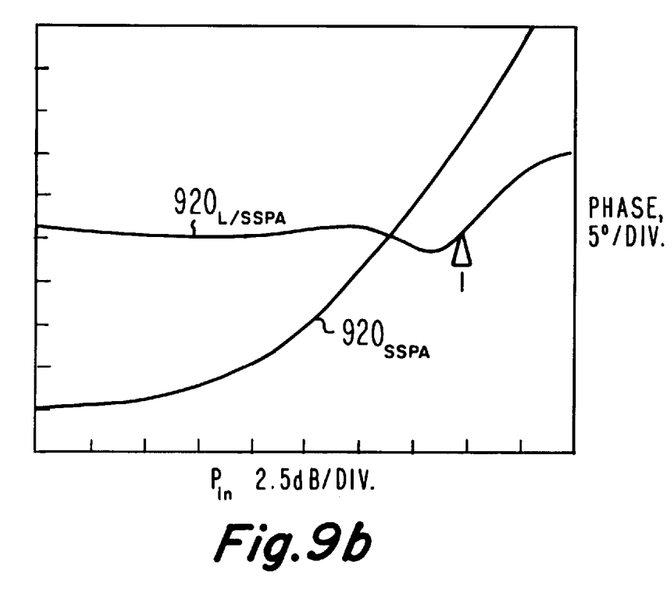

FIG. 9a plots gain (0.5 db/division) and output power (2.5 dB/division) against input power (2.5 dB/division) of a driver/output stage combination such as 14,18 of FIG. 8 at 3.6 GHz, both with and without a linearizer 814 preceding the driver, and FIG. 9b plots phase (5°/division) with and without the linearizer. More particularly, plot $910_{SSPA}$ represents the gain of the cascade of the driver 14 with output state 18, and plot $910_{L/SSPA}$ represents the gain of the cascade of the linearizer 814, driver 14, and output stage 18. As would be expected, the plots $912_{SSPA}$ and $912_{L/SSPA}$ show that for low input power levels, the linearized input/output power transfer function is more linear than the unlinearized transfer function, and the phase change represented by linearized phase plot $920_{L/SSPA}$ deviates less than the unlinearized phase represented by plot $920_{SSPA}$. What might not be expected is that, in the absence of the linearizer, plot $910_{SSPA}$ of the driver/output stage alone has a 1 dB gain compression point at dash-line 914, which is about 6 dB below the hard saturation level at 916. In the presence of the linearizer, plot $910_{L/SSPA}$ has its one-dB compression point about 1 dB from hard compression.

These measurements, made with a single input signal, guarantee protection of the output stages in the presence of multiple carriers, as described above.

Other embodiments of the invention will be apparent to those skilled in the art. For example, while the driver stage has been described as being the amplitude limiter of a system including an output stage, the driver stage could itself be a combination of an amplifier combined with a discrete limiter.

Thus, according to an aspect of the invention, a signal amplifying system (8) includes an output port (20) at which amplified signal is generated. The system (8) also includes a field-effect transistor (18a, . . . , 18n) including a gate, a source, and drain. The FET may be GaAs-based. The FET is connected in common-source configuration for amplification of signal, and is subject to permanent degradation of its performance when the gate signal reaches a particular power level. The particular gate power level at which degradation occurs varies from transistor to transistor, even within the same transistor type. The drain (18ad) of the FET is coupled (by 19) to the output port (20) of the amplifying system (8) without intermediary active stages. Consequently, the FET (18a) is part of an output stage of the signal amplifying system (8). The signal amplifying system (8) also includes a source (10) of multiple modulated carrier signals to be amplified. A driver amplifier stage (14) includes an input port (14i) and an output port (14o). The output port (14o) of the driver amplifier stage (14) is coupled to the gate (18ag) of the FET (18a) without intermediary active stages. The driver amplifier stage (14) has a distortion characteristic (610, 612, 614) such that, for a single-carrier signal, the one-dB compression point (614) is within four dB of input signal of the hard power saturation point (616). A coupling arrangement (12) is coupled to the source of multiple modulated carrier signals (10) and to the input port (14i) of the driver amplifier stage (14), for coupling the multiple modulated carrier signals to the driver stage (14) at a signal level (616) which drives the driver amplifier stage into saturation, and such that the instantaneous peak envelope signal level at the output port ($14_o$) of the driver stage never exceeds the maximum input power level to the gate of the FET which is specified by the manufacturer of the FET for reliable operation. The maximum input power level to the FET is normally specified by the manufacturer in terms of a maximum average gate current, so the saturated output of the driver amplifier stage as it arrives at the gate of the FET should not cause a gate current exceeding the specified gate current. This adjustment of the driver amplifier stage (14) provides good performance with complete protection of the output FET (18a). In a variant of this embodiment, a distortion equalizer (814) is coupled between the source of multiple carrier signals (10) and the input port (14i) of the driver amplifier stage (14), with its characteristics selected so as to reduce the four dB range to less than one dB.

What is claimed is:

1. A signal amplifying system including an output port at which amplified signal is generated, said system comprising:

a GaAs-based field-effect transistor including a gate, source, and drain, connected in common-source configuration for amplification of signal, said FET being subject to permanent degradation of its performance when the gate signal reaches a particular power level, which particular power level may be different for different FETs of the same type, said drain of said FET being coupled to said output port of said amplifying system without intermediary active stages;

a source of multiple modulated carrier signals to be amplified;

a driver amplifier stage including an input port and an output port, said output port of said driver amplifier stage being coupled to said gate of said FET without intermediary active stages, said driver amplifier stage having a single-signal one-dB compression point which is within four dB of input signal of the single-signal hard power saturation point;

coupling means coupled to said source of multiple modulated carrier signals, to said input port of said driver amplifier stage, for coupling said multiple modulated carrier signals to said driver stage at a signal level which drives said driver amplifier stage into saturation, and such that the instantaneous peak envelope signal level out of the driver stage never exceeds the specified input power level for reliable operation.

2. A signal amplifying system including an output port at which amplified signal is generated, said system comprising:

a GaAs-based field-effect transistor including a gate, source, and drain, connected in common-source configuration for amplification of signal, said FET being subject to permanent degradation of its performance when the gate signal reaches a particular power level, which particular power level may be different for different FETs of the same type, said drain of said FET being coupled to said output port of said amplifying system without intermediary active stages;

a source of multiple modulated carrier signals to be amplified;

a driver amplifier stage including an input port and an output port, said output port of said driver amplifier stage being coupled to said gate of said FET without intermediary active stages, said driver amplifier stage having a single-signal one-dB compression point which is within four dB of input signal of the single-signal hard power saturation point;

coupling means coupled to said source of multiple modulated carrier signals, to said input port of said driver amplifier stage, for coupling said multiple modulated carrier signals to said driver stage at a signal level which drives said driver amplifier stage into saturation, and such that the instantaneous peak envelope signal level out of the driver stage never exceeds the specified input power level for reliable operation, said system further comprising:

a distortion equalizer coupled between said source of multiple carrier signals and said input port of said driver amplifier stage, the characteristics of said distortion equalizer being such as to reduce said four dB range to less than one dB.

3. A method for producing a solid-state RF amplifier, for multichannel use, comprising the steps of;

selecting a FET output stage providing the desired multichannel output power at a given multichannel input power level, and noting the maximum average gate current of said FET which is specified for reliable operation;

selecting a driver stage which produces said multichannel input power level for said output stage, and which has single-channel one-dB gain compression within four dB of hard saturation;

cascading said output stage with said driver stage; and verifying that said gate current is below said maximum average gate current when said driver stage is in hard single-channel saturation.

4. A method for producing a solid-state RF amplifier, for multichannel use, comprising the steps of;

selecting a FET output stage providing the desired multichannel output power at a given multichannel input power level, and noting the maximum average gate current of said FET which is specified for reliable operation;

selecting a driver stage which produces said multichannel input power level for said output stage, and which has single-channel one-dB gain compression within four dB of hard saturation;

cascading said output stage with said driver stage; and verifying that said gate current is below said maximum average gate current when said driver stage is in hard single-channel saturation, said method her comprising the step of passing signal through a linearizer before application to said driver stage.

* * * * *